US006917082B1

(12) United States Patent
Loo

(10) Patent No.: US 6,917,082 B1
(45) Date of Patent: Jul. 12, 2005

(54) GATE-BODY CROSS-LINK CIRCUITRY FOR METAL-OXIDE-SEMICONDUCTOR TRANSISTOR CIRCUITS

(75) Inventor: Kok-Weng Loo, Kuala Lumpur (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/764,840

(22) Filed: Jan. 26, 2004

(51) Int. Cl.[7] .................. H01L 29/76; H01L 29/94; H01L 31/062; H01L 31/113; H01L 31/119
(52) U.S. Cl. ................................. 257/368; 257/476
(58) Field of Search ............................ 257/368, 476

(56) References Cited

U.S. PATENT DOCUMENTS

| | | | |
|---|---|---|---|
| 5,990,521 A | * 11/1999 | Horiuchi | 257/369 |
| 6,700,793 B2 | * 3/2004 | Takagawa et al. | 361/777 |
| 6,784,487 B2 | * 8/2004 | Plikat | 257/327 |

OTHER PUBLICATIONS

Andy Wei et al. "Design Methodology for Minimizing Hysteretic Vt–Variation in Partially–Depleted SOI CMOS" (c) 1997 IEEE in IEDM 97 pp. 411–414.
"SOI Technology: IBM's Next Advance in Chip Design" IBM Corporation (undated).
Ghavam G. Shahidi et al. "Partially–Depleted SOI Technology for Digital Logic," 1999 IEEE International Solid–State Circuits Conference, IEEE 1999.
Jean–Luc Pelloie, SOI CMOS requires complex modeling http://www.eetimes.com/story/OEG20020923S0060 Sep. 23, 2002, EETIMES.
Vaughn Betz et al., "Circuit Design, Transistor Sizing and Wire Layout of FPGA Interconnect," IEEE Custom Integrated Circuits Conference, 1999 pp. 1–4.

Koushik K. Das et al., "Circuit Style Comparison based on the Variable Voltage Transfer Characteristic and floating B Ratio Concept of Partially Depleted SOI" (undated) Sep. 17, 2002.
"CMOS Devices and Reliability—SOD Devices & Circuits (Session 16)" IEDM 1997.
Alan Joch "Silicon on Insulator", Computerworld Dec. 18, 2000.
"Silicon On Insulator" Technology Article—Devient PC http://www.deviantpc.com/articles/SOI/index.shtml (Apr. 2003).
"SOI Circuit Design Concepts" pp 34, 35, and 196–209.
Robert Richmond, "Silicon–on–Insulator Technology" www.sysopt.com/articles/soi/index3.html Nov. 8, 2000.
"Silicon on Insulator"; http://www.okisemi.com/jp/english/bt–soi.htm Apr. 25, 2003.
Jacques Gautier et al., "SOI Floating–Body, Device and Circuit Issues", IEDM 1997 pp 407–410.
J.P. Colinge et al., Potential of SOI for Analog and Mixed Analog–Digital Low–Power Applications, 1995 IEEE International Solid–State Circuits Conference (IEEE 1995).
Carlos Mazure et al., "ICs tailored for exotic substances", EE Times, Sep. 23, 2002.
Andre Auberton–Herve, "SOI sharpens the leading edge as silicon scales to 90 nanometers", EE Times Sep. 23, 2002.

* cited by examiner

Primary Examiner—Ngân V. Ngô
(74) Attorney, Agent, or Firm—G. Victor Treyz

(57) ABSTRACT

A gate-body cross-linked metal-oxide-semiconductor transistor circuit is provided for use in integrated circuits. The circuit has parallel metal-oxide-semiconductor transistors. The sources of the transistors serve as circuit inputs and the drains of the transistors are tied together to form an output. Complementary control signals are applied to the gates of the transistors, so that one transistor is turned on when the other transistor is turned off. Schottky diodes are used to cross-link the transistors. Each Schottky diode has an anode formed from a transistor body and a cathode connected to a gate.

15 Claims, 5 Drawing Sheets

GATE-BODY CROSS-LINK CIRCUITRY FOR METAL-OXIDE-SEMICONDUCTOR TRANSISTOR CIRCUITS

BACKGROUND OF THE INVENTION

This invention relates to integrated circuits, and more particularly, to ways in which to improve the performance of metal-oxide-semiconductor transistor circuits on integrated circuits by cross-linking the gates and bodies of certain transistors.

Integrated circuits based on metal-oxide-semiconductor (MOS) transistor technology are widely used in modern electronic systems. As device dimensions shrink due to improvements in process technology, silicon-on-insulator (SOI) substrates are being considered for future generations of MOS integrated circuits.

MOS transistors such as the MOS transistors found on SOI substrates have four terminals: a source, a drain, a gate, and a body (sometimes also called the substrate). If the body terminal of an MOS transistor is allowed to float, the signals on the other terminals of the transistor will affect the body.

The voltage on the body, in turn, affects the electrical properties of the transistor. A low body voltage serves to increase the threshold voltage of the transistor and a high body voltage serves to decrease the threshold voltage. If the body voltage is low, the transistor will be harder to turn on and will therefore switch more slowly. If the body voltage is high, the transistor will switch more rapidly.

Because the voltages on the gate, source, and drain terminals of a transistor influence the body voltage and therefore the threshold voltage and switching speed of the transistor, transistors with floating bodies tend to experience hysteresis. Different types of pulses and different patterns of pulses will propagate through a circuit made from MOS transistors with floating bodies differently. The dependence of the electrical behavior of a MOS transistor with a floating body on its environment can be difficult to model and can make device performance unpredictable.

The performance of an MOS transistor can be made more predictable by electrically connecting the body to a source of known potential (i.e., to ground). Such "tied-body" configurations offer predictable performance, because the body is maintained at a known constant voltage, regardless of the signals applied to the gate, source, and drain terminals.

However, tied-body configurations in which the body is grounded tend to have high threshold voltages. The body contact diffusions and contact pads used for tied-body transistors also tend to consume a fair amount of real estate and may add undesirable complexity to the fabrication process.

It is an object of the present invention to provide improved MOS transistor arrangements that overcome some of the problems associated with floating body and tied-body structures.

SUMMARY OF THE INVENTION

In accordance with the present invention metal-oxide-semiconductor transistor circuits are provided that use Schottky diodes to cross-link the gates and bodies of pairs of transistors.

A cross-linked circuit may have first and second metal-oxide-semiconductor transistors. Each transistor may have two source-drain terminals, a gate terminal, and a body (or substrate) terminal. The cross-linked circuit may have at least two inputs and an output. A source-drain terminal from each of the metal-oxide-semiconductor transistors may serve as an input. The other source-drain terminal of each resistor may be connected to the output.

The gate of the first transistor may be controlled by a control signal. Circuitry is used to invert the control signal to produce a complementary version of the control signal. While the control signal is applied to the gate of the first transistor, its complement is applied to the gate of the second transistor. With this arrangement, the second transistor is turned on when the first transistor is turned off and the second transistor is turned off when the first transistor is turned on.

The gates and bodies of the first and second transistors may be cross-linked using first and second Schottky diodes. Each diode may have an anode and a cathode. The anode of the first Schottky diode may be formed from the body of the first transistor and the cathode of the first Schottky diode may be connected to the gate of the second transistor. The anode of the second Schottky diode may be formed from the body of the second transistor and the cathode of the second Schottky diode may be connected to the gate of the first transistor.

During operation of the device, various signals are applied to the circuit. These signals change the voltages of the bodies of the transistors in the cross-linked circuit. Due to the presence of the Schottky diodes, the maximum voltage swing of each body tends to be less than would be exhibited in conventional floating-body transistor circuits. Moreover, the switching speed of the cross-linked circuit tends to be faster than conventional body-tied transistor circuits and consumes less real estate on the integrated circuit.

The gate-body cross-linked transistor circuits may be used in any suitable application such as in a two-input multiplexer or a two-input pass gate. Larger circuits (e.g., N-input multiplexers or N-input pass gates where N is four or more) may be provided by combining multiple pairs of cross-linked transistors.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to metal-oxide-semiconductor (MOS) transistor integrated circuits. The present invention also relates to arrangements for cross-linking body and gate terminals in pairs of MOS transistors to overcome some of the problems associated with conventional floating-body and body-tied MOS transistors.

Figure 1:
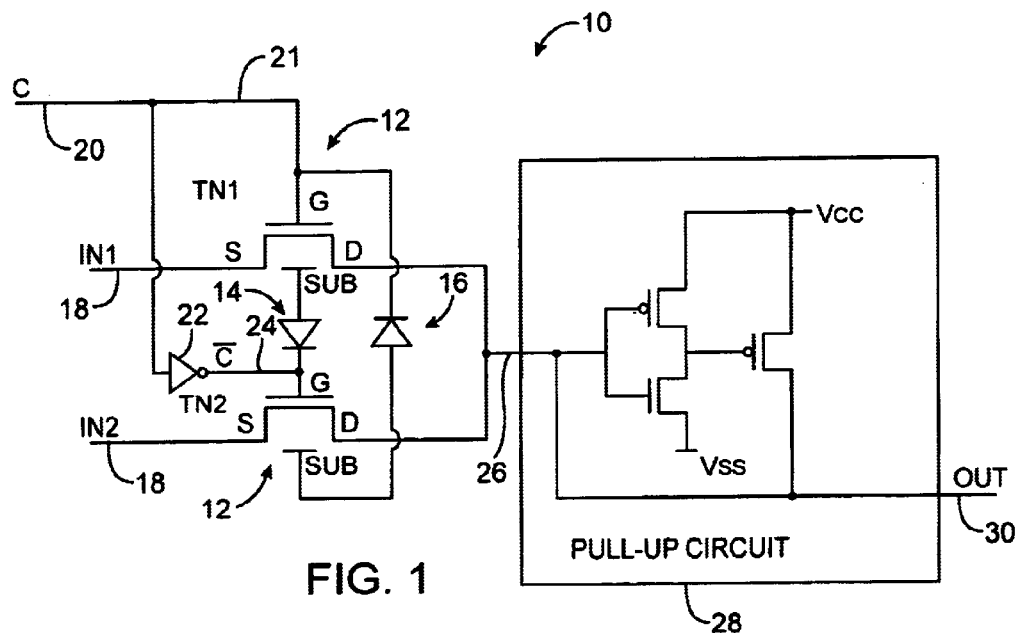
FIG. 1 is a diagram of an illustrative metal-oxide-semiconductor (MOS) circuit with a gate-body cross-link structure in accordance with the present invention.

A circuit 10 in accordance with the present invention is shown in FIG. 1. Circuit 10 is based on a pair of cross-linked MOS transistors 12 (i.e., transistor TN1 and transistor TN2). Transistors TN1 and TN2 are cross-linked by Schottky diodes 14 and 16. Diode 14 connects the body terminal SUB of transistor TN1 to the gate G of transistor TN2. Diode 16 forms an electrical connection between the gate G of TN1 and the body SUB of TN2. By cross-linking the gates and bodies of the transistors 12, the effects of hysteresis that are experienced in floating-body transistors arrangements can be reduced, while maintaining satisfactory switching speeds. Moreover, it is not necessary to reduce performance and/or increase real estate consumption by using a body-tied arrangement.

Pairs of MOS transistors 12 with cross-linked bodies and gates of the type shown in FIG. 1 may be used in a variety of circuits, such as multiplexers, circuits based on pass-transistors arrangements, etc. In the illustrative example of FIG. 1, MOS transistors are used to form a two-input multiplexer. The inputs 18 to the multiplexer are labeled IN1 and IN2.

A control signal C may be provided to control terminal 20. An uninverted version of this signal C may be applied to gate G of transistor TN1 by line 21. Inverter 22 or other suitable circuitry may be used to invert signal C to provide its complement (NOT C). The inverted version of C is applied to gate G of transistor TN2 via line 24. The drain terminal outputs of transistors TN1 and TN2 are connected to output 26, which is connected to circuit output 30 and pull-up circuit 28.

With a complementary drive signal arrangement of the type shown in FIG. 1, only one of transistors 12 can be turned on at a time. If transistor TN1 is turned on, for example, transistor TN2 will be turned off. If transistor TN2 is turned on, transistor TN1 will be off.

Figure 2:
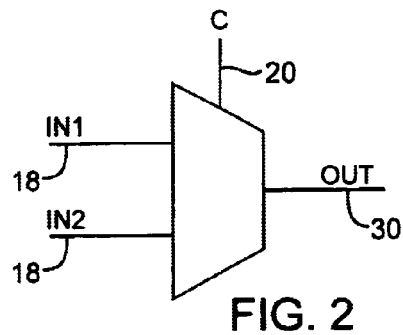
FIG. 2 is a diagram of an illustrative multiplexer-type circuit that can be constructed using cross-linked MOS transistors of the type shown in FIG. 1.

A circuit schematic showing how a two-input multiplexer-type circuit may be formed from a cross-linked transistor circuit such as circuit 10 is shown in FIG. 2.

The transistors of the example of FIG. 1 are n-channel devices. This is merely illustrative. P-channel devices can also be cross-coupled using Schottky diodes if desired. Moreover, the transistors 12 of FIG. 1 have their source terminals S connected to inputs IN1 and IN2 and their drain terminals D connected to output line 26. Because of the inherent symmetry of MOS devices, it is generally not critical whether the sources S or drains D are used as inputs (or outputs). Source terminals and drain terminals may therefore be referred to generically as "source-drain" terminals and the labels "S" and "D" on transistors 12 can be reversed in the FIGS. if desired.

Circuits such as circuit 10 are generally fabricated as part of a much more complex integrated circuit. A number of power supply voltages may be used to operate the integrated circuit. For example, a positive power supply voltage Vcc of about 1 volt and a ground power supply voltage Vss of about 0 volts may be used to operate the integrated circuit. These voltages levels are merely illustrative. Any suitable power supply voltage levels may be used to power circuits such as circuit 10 if desired.

Circuit 10 may receive digital logic signals at inputs IN1 and IN2 and at control terminal 20. The digital logic signals may vary between a logic high level of about Vcc (i.e., about 1 volt) and a logic low level of about Vss (i.e., about 0 volts). There is a threshold voltage Vt associated with each of transistors 12, so the maximum signal voltage that is presented to the output line 26 is about Vcc−Vt. To ensure proper interoperability of circuit 10 with other digital logic on the integrated circuit, it is generally desirable to pull this voltage level back up to Vcc, using a weak pull-up circuit such as pull-up circuit 28. When pull-up circuit 28 is used, signals that would otherwise have a voltage swing of Vss to Vcc−Vt at the outputs of transistors 12 are converted into acceptable digital logic signals with a voltage swing of Vss to Vcc at output terminal 30. In the other FIGS., the pull-up circuit 28 is not shown to avoid over-complicating the drawings. However, such a pull-up circuit (or other suitable circuitry) may be used if desired.

Cross-linking between the body and gate terminals of transistors 12 may be accomplished using opposing Schottky diodes 14 and 16. Schottky diodes 14 and 16 may be formed by depositing tungsten, copper, or other suitable metals or combinations of metals on the silicon of the bodies of transistors TN1 and TN2. The silicon bodies of the transistors form the anodes of the Schottky diodes and the metal layers that are deposited on the silicon body regions form the cathodes of the Schottky diodes. This type of arrangement is shown in FIG. 3.

Figure 3:
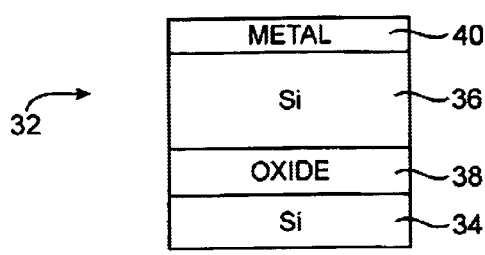
FIG. 3 is a cross-sectional side view of a portion of a MOS transistor and Schottky diode on a silicon-on-insulator circuit showing how the Schottky diode may be formed by placing a metal cathode layer in contact with a silicon body anode in accordance with the present invention.

The cross-sectional diagram of FIG. 3 shows how the Schottky diodes 14 and 16 for circuit 10 may be formed on silicon-on-insulator (SOI) substrate 32. SOI substrates may be desirable for forming circuits such as circuit 10, because SOI transistor structures are generally capable of fast switching speeds. In an SOI transistor, the underlying silicon substrate wafer 34 is separated from a thin top layer of silicon 36 by a buried oxide layer 38.

The source and drains of transistors 12 may be formed by implanting dopant in layer 36 in high concentrations. The gate of each transistor 12 may be formed by fabricating a thin insulating layer such as a thin silicon oxide layer over an underlying channel region in layer 36 between a laterally-spaced source and drain. The body of each transistor is the portion of silicon layer 36 in the vicinity of the gate, source, and drain (i.e., the portion of layer 36 under the channel region and between the source and drain). The Schottky diodes 14 and 16 may be formed by forming a pattered metal layer 40 that directly contacts each body region 36, as shown in FIG. 3.

On the "body" end of each diode, a metal layer 40 contacts silicon layer 36 to form a Schottky diode. The metal layer 40 is the diode's cathode terminal. The silicon layer 36, which is part of the body region of the transistor, forms the diode's anode terminal. On the "gate" end of each diode, metal 40 can either be used as the gate conductor itself or may make an ohmic contact to a suitable gate conductor (e.g., doped polysilicon, silicide, etc.). The diodes 14 and 16 are cross-coupled, so that the body end of diode 14 is formed with the body SUB of transistor TN1, while the gate end of diode 14 is formed with the gate G of transistor TN2. Similarly, the body end of diode 16 is connected to the body SUB of transistor TN2, whereas the gate end of diode 16 is electrically connected to the gate G of transistor TN1. With this configuration, the anode of diode 14 is formed from the body of TN1 and the cathode of diode 14 is connected to the gate of TN2. The anode of diode 16 is formed from the body of TN2 and the cathode of diode 16 is connected to gate 12.

There is a gate delay associated with propagating signals through MOS transistor circuits. Consider, as an example, two MOS transistors whose gates are driven by complementary control signals C and NOT C, whose source terminals serve as parallel inputs, and whose drains are tied together in the same way as circuit 10 of FIG. 1. The two parallel MOS transistors may, as an example, be receiving a low input at one of their source terminal inputs and a high input signal at another source terminal input. The behavior of this type of circuit arrangement when the control signal C changes from high to low is shown in the timing diagrams of FIGS. 4a, 4b, and 4c.

Figure 4A:
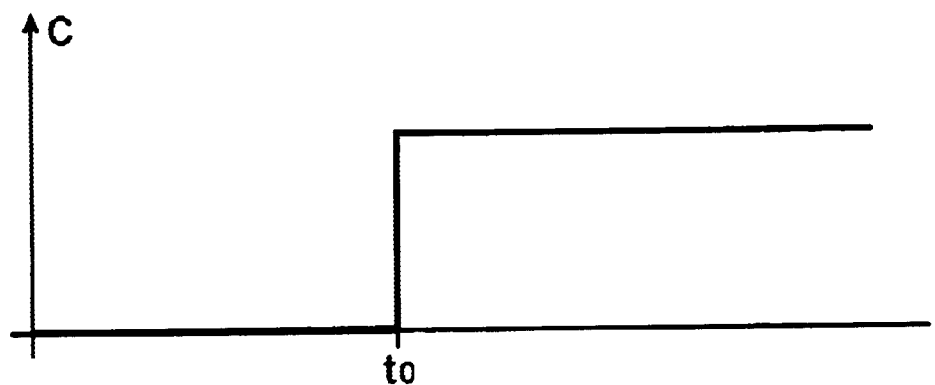
FIGS. 4a, 4b, and 4c are timing diagrams showing how there is a gate delay associated with switching MOS-based transistor circuits.
Figure 4B:
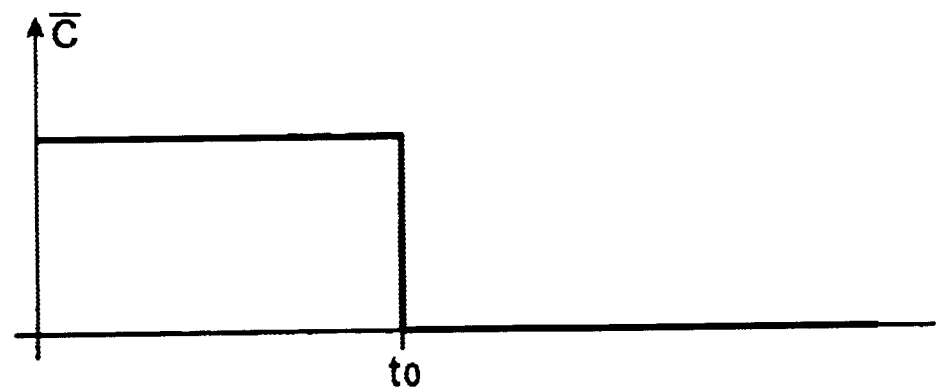
Figure 4C:
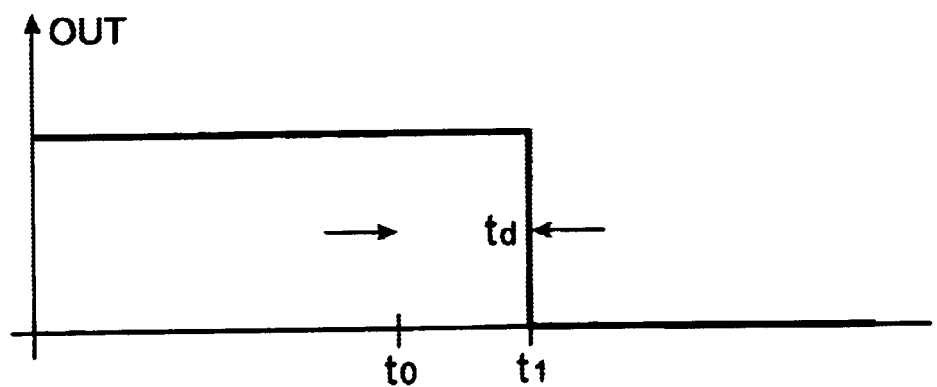

As shown in FIGS. 4a and 4b, the control signal and its complement switch at time $t_0$. However, as shown in FIG. 4c, the output signal OUT does not switch immediately at $t_0$. Rather, there is a non-zero gate delay $t_d$ associated with switching the output, so OUT switches at a later time $t_1$. The magnitude of the gate delay $t_d$ is governed by the behavior of the MOS transistor that was off just prior to the change in the state of the control signal C. If this transistor switches quickly, $t_d$ will be small. If this transistor switches slowly, $t_d$ will be large.

A number of factors influence the gate delay $t_d$ of a switching circuit. For example, the geometry of the transistors, the critical feature size of the transistors (i.e., gate length), the type of semiconductor used, whether the transistor is formed on bulk or SOI substrate materials, etc. These factors are static and, once a transistor of a particular design is fabricated, they do not change. The gate delay $t_d$ of a switching circuit is also affected by dynamic factors such as the voltage on the transistor's body. The voltage on a given transistor's body is determined by the signals applied to the transistor's terminals and the parasitics of the device (e.g., parasitic capacitances and leakage currents associated with junctions in the device, etc.)

In general, it is desirable to have transistors with gate delays $t_d$ that are as small as possible. Predictable and stable gate delays are also desirable, because this makes it easier to model circuit behavior and ensure proper operation of the circuit.

Figure 5:
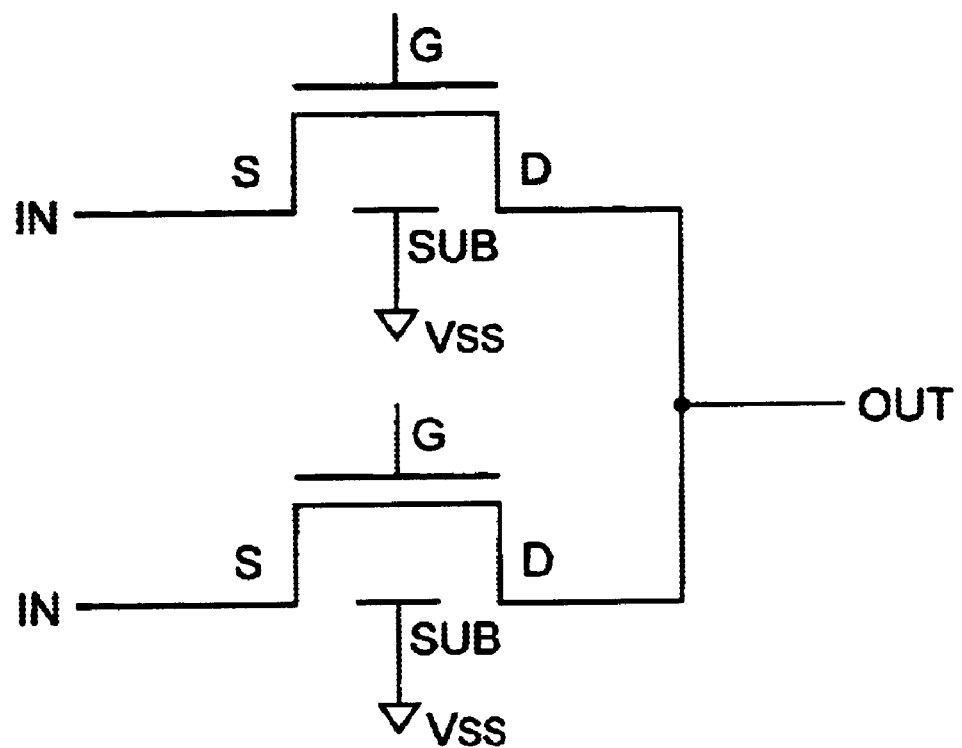
FIG. 5 is a diagram of a conventional two-transistor body-tied MOS transistor circuit.

One conventional approach for stabilizing gate delays $t_d$ is known as the "body-tied" approach. With a conventional body-tied approach, the body terminals SUB of the MOS transistors in the circuit are tied to a known potential (i.e., a ground voltage Vss). A two-input multiplexer circuit based on this type of arrangement is shown in FIG. 5. Because the SUB terminals are electrically connected to ground, the voltage on the SUB terminals does not change. This makes the gate delays $t_d$ associated with body-tied transistors stable and predictable.

In an n-channel MOS transistor, the channel region of the transistor is formed in an p-type body (i.e., a p-type well). A p+ heavily-doped region is used to make an ohmic contact to the p-type body. The p+ contact is grounded to Vss, thereby grounding the body of the transistor. Because the body region is grounded, the voltage on the body does not change significantly, even under a variety of operating conditions. As a result, the gate delay $t_d$ of a body-tied transistor will not exhibit significant variations. However, the body contacts (i.e., the p+ contact regions in an n-channel transistor) consume valuable real estate. MOS transistors also switch most slowly when the body potential is near ground, so tying the body terminals SUB to Vss results in a worst-case scenario for the gate delay $t_d$.

Real estate consumption can be reduced and gate delays can be lowered by omitting the body-to-ground contacts of FIG. 5. This approach, which is called the "floating-body" approach, uses body terminals that are not grounded. When MOS transistors circuits are formed using a conventional floating-body arrangement, the body region electrically "floats" because it is not tied to any particular potential.

The floating body terminals SUB of such a conventional floating-body MOS transistor may take on different voltages depending on which signals are applied to its gate, source, and drain terminals. A conventional floating-body transistor circuit under various different applied signal conditions is shown in FIGS. 6a, 6b, 6c, and 6d. The delay time $t_d$ of the circuit of FIGS. 6a, 6b, 6c, and 6d is governed by the switching speed of the "off" transistor (TN1 in this example). The switching speed of TN1 is influenced by its effective threshold voltage, which is influenced by its body voltage. The body voltage, in turn, is influenced by the voltage on the gate, source, and drain terminals.

Figure 6A:
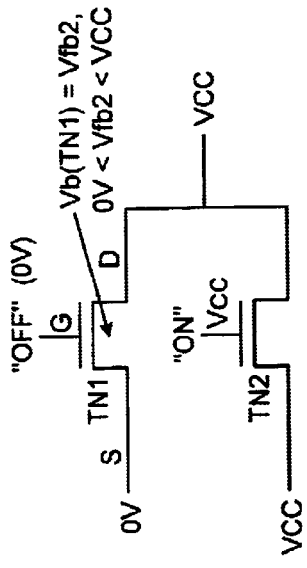
FIGS. 6a, 6b, 6c, and 6d are diagrams of a conventional two-transistor floating-body MOS transistor circuit under various loading conditions.

Under conditions of the type shown in FIG. 6a, the gate, source, and drain of transistor TN1 are at 0 volts and the resulting body voltage Vb(TN1) of transistor TN1 is about 0 volts. Under the conditions of FIGS. 6b, 6c, and 6d, drain-to-body p-n junction leakage current charges the body. Under the conditions of FIG. 6b, the body voltage Vb(TN1) of transistor TN1 is Vfb2, which lies between 0 volts and Vcc. Under the conditions of FIG. 6c, the body voltage Vb(TN1) of transistor TN1 is equal to Vfb3, which also lies between 0 volts and Vcc. Under the input conditions of FIG. 6d, the body voltage Vb(TN1) of transistor TN1 is equal to Vfb4, which is about Vcc.

As shown by the examples of FIGS. 6a, 6b, 6c, and 6d, the body voltage (and therefore the effective threshold voltage) of transistor TN1 varies depending on its environment. Under certain operating conditions (such as the conditions of FIG. 6a), the body voltage is low (0 volts), so transistor TN1 switches slowly and $t_d$ is at a maximum. Under other operating conditions (such as the conditions of FIG. 6d), the body voltage is high (Vcc), so transistor TN1 switches quickly and $t_d$ is at a minimum. The strong voltage-dependence of $t_d$ creates undesirable hysteresis effects as digital signals propagate through the circuit.

The gate-body cross-linked circuits of the present invention exhibit less gate delay hysteresis than floating body circuits, while consuming less real estate and switching more rapidly than body-tied circuits. A gate-body cross-linked circuit 10 in accordance with the present invention under various different applied signal conditions is shown in FIGS. 7a, 7b, 7c, and 7d. The pull-up circuit 28 that is shown in FIG. 1 is not shown in FIGS. 7a, 7b, 7c, and 7d to avoid over-complicating these drawings.

The transistors TN1 and TN2 of FIGS. 7a–7d may be operated in a complementary arrangement using an inverter circuit or other suitable circuitry of the type shown in FIG. 1. When control signal C is applied to the gate of transistor TN1, the complementary signal NOT C is applied to the gate of transistor TN2. Accordingly, when TN1 is on, transistor TN2 is off and vice versa.

As with the conventional floating-body circuit of FIGS. 6a, 6b, 6c, and 6d, the delay time $t_d$ of the circuit 10 of FIGS. 7a, 7b, 7c, and 7d is governed by the switching speed of the "off" transistor. In this example, the "off" transistor is transistor TN1. The switching speed of TN1 is influenced by its effective threshold voltage, which is influenced by the body voltage produced by the voltages on the gate, source, and drain terminals.

Figure 7B:
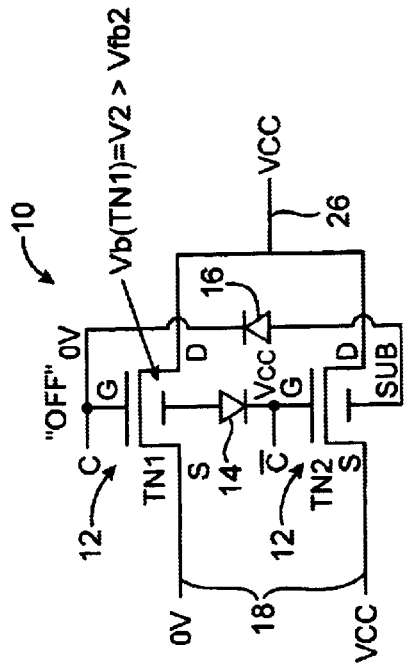
FIGS. 7a, 7b, 7c, and 7d are diagrams of a two-transistor circuit having pair of gate-body cross-linked MOS transistors in accordance with the present invention.
Figure 7D:
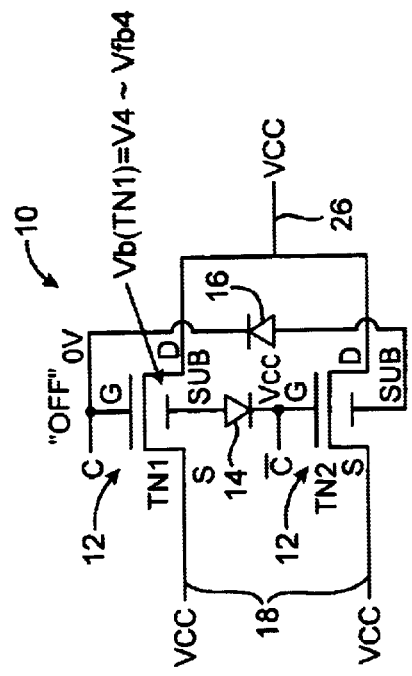
Figure 7A:
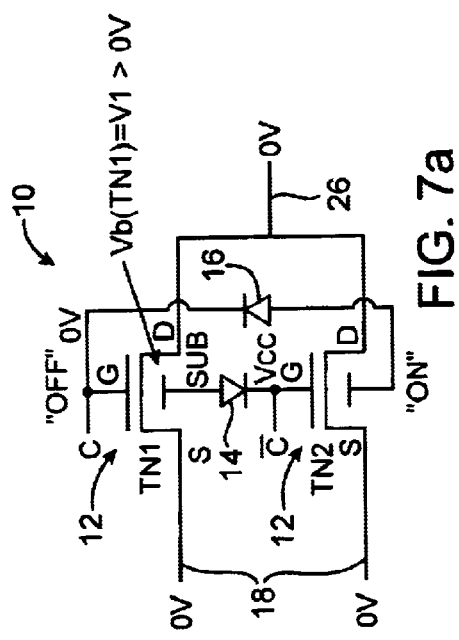

Under conditions of the type shown in FIG. 7a, the gate, source, and drain of transistor TN1 are at 0 volts. The gate G of transistor TN2 is at Vcc, so Schottky diode 14 is reversed biased. The body (SUB) of TN1 charges through diode 14. The resulting body voltage Vb(TN1) of transistor TN1 is V1. Due to the presence of the Schottky diode 14, the body voltage V1 is greater than 0 volts. The threshold voltage of transistor TN1 is therefore lower in the gate-body cross-linked circuit of FIG. 7a than in the conventional floating-gate circuit of FIG. 6a. The circuit 10 of FIG. 7a therefore switches more quickly than the circuit of FIG. 6a and has a shorter gate delay $t_d$.

Figure 6B:
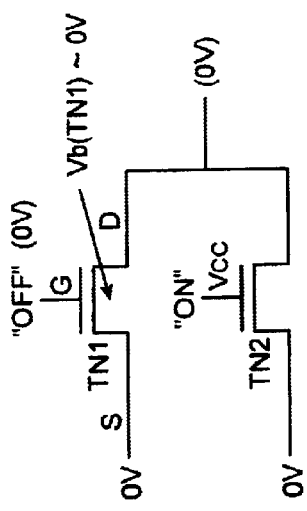
Figure 6C:
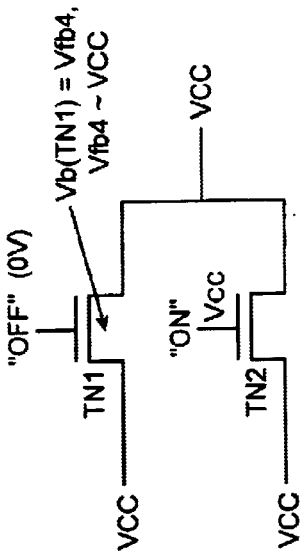
Figure 7C:
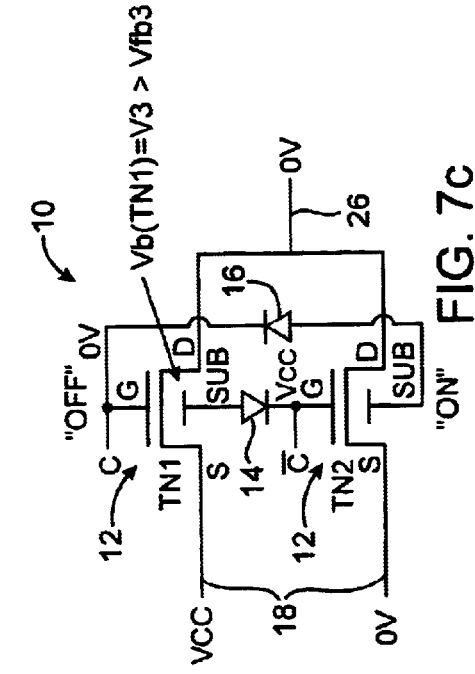

Under the conditions of FIGS. 7b and 7c, the body of transistor TN1 charges through both the reverse-biased Schottky diode 14 and the drain-to-body p-n junction. Schottky diode 14 is weakly reverse biased because the gate G of transistor TN2 is at Vcc (i.e., TN2 is on). The resulting body voltages V2 and V3 are greater than the corresponding body voltages Vfb2 and Vfb3 in the conventional floating-body circuit of FIGS. 6b and 6c.

The body voltage V2 on TN1 under the conditions of FIG. 7b is greater than Vfb2 (i.e., V2>Vfb2), so the threshold voltage of the cross-linked transistor TN1 in FIG. 7b is lower than the threshold voltage of the conventional floating-body transistor TN1 in FIG. 6b. As a result, the circuit of FIG. 7b will have a shorter gate delay $t_d$ and will switch more rapidly than the circuit of FIG. 6b.

Similarly, the body voltage V3 on TN1 under the conditions of FIG. 7c is greater than Vfb3 (i.e., V3>Vfb3), so that the threshold voltage of the cross-linked transistor TN1 under the conditions of FIG. 7c is lower than the threshold voltage of the conventional floating-body transistor TN1 of FIG. 6c when presented with the same source, gate, and drain voltages. The cross-linked transistor circuit of FIG. 7c will therefore exhibit a faster switching speed (lower td) than the conventional floating-body transistor circuit of FIG. 6c.

Figure 6D:
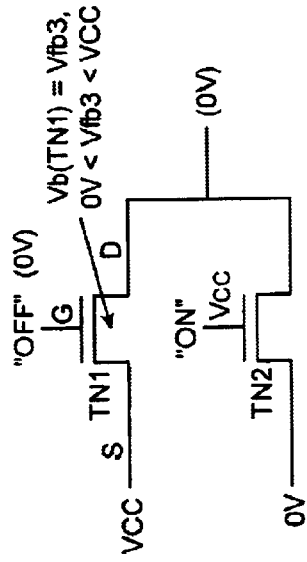

Under the conditions of FIG. 7d, the body voltage V4 on TN1 is about Vfb4 (about Vcc), so the gate delay td and switching speed of the cross-linked circuit of FIG. 7d is comparable to that of the floating-gate circuit of FIG. 6d. However, the gate-body cross-linked circuit arrangement has less hysteresis in $t_d$ than conventional floating-body circuits. This is because the difference between the worst-case $t_d$ and best-case $t_d$ is less for a gate-body cross-linked circuit than for a floating-body circuit.

In the floating-body circuit of FIGS. 6a–6d, the worst-case $t_d$ is associated with a body voltage of 0 volts (FIG. 6a) and the best-case $t_d$ is associated with a body voltage of Vcc (FIG. 6d). The hysteresis for the floating body of FIGS. 6a–6d is therefore proportional to Vcc–0=Vcc. In contrast, in the gate-body cross-linked circuit 10 of FIGS. 7a–7d, the worst-case $t_d$ is associated with a body voltage V1 of greater than 0 volts (FIG. 7a), whereas the best-case $t_d$ is associated with a body voltage of Vcc (FIG. 7d). The hysteresis for the cross-linked gate-body circuit of FIGS. 7a–7d is therefore proportional to Vcc–V1. Because Vcc–V1 is less than Vcc–0, the gate delay hysteresis for the cross-linked circuit tends to be less than the gate delay hysteresis of conventional floating-gate circuits.

Moreover, gate delay performance for the worst-case gate delay $t_d$ (i.e., the gate delay associated with FIG. 7a) is improved relative to the gate delay of the floating body arrangement of FIG. 6a, so the cross-linked circuit is generally faster than conventional floating-gate circuits under all conditions. Use of a cross-linked gate-body arrangement of the type shown in FIGS. 7a–7d and FIG. 1 can therefore improve both switching speed and gate delay hysteresis, while avoiding the real estate costs and slow switching speeds associated with body-tied approaches.

To minimize loading effects, Schottky diodes 14 and 16 are preferably constructed to minimize AC coupling between the gates and bodies of transistors TN1 and TN2 (e.g., by using a minimal surface area in the body-to-metal contact at the body end of each diode and by using small structures at the metal-to-gate-conductor end of each diode to reduce interaction between the gates and bodies).

A two-transistor gate-body cross-linked transistor circuit such as the circuit of FIG. 1 and FIGS. 7a–7d may be used in any suitable application such as in a two-input multiplexer or a two-input pass gate. Larger circuits (e.g., N-input multiplexers or N-input pass gates where N is four or more) may be provided by combining pairs of cross-linked circuits.

The foregoing is merely illustrative of the principles of this invention and various modifications can be made by those skilled in the art without departing from the scope and spirit of the invention.

What is claimed is:

1. A gate-body cross-linked metal-oxide-semiconductor transistor circuit comprising:

a first metal-oxide-semiconductor transistor having a gate, a source, a drain, and a body;

a second metal-oxide-semiconductor transistor have a gate, a source, a drain, and a body;

a first Schottky diode connecting the body of the first metal-oxide-semiconductor transistor to the gate of the second metal-oxide-semiconductor transistor; and a second Schottky diode connecting the body of the second metal-oxide-semiconductor transistor to the gate of the first metal-oxide-semiconductor transistor.

2. The gate-body cross-linked metal-oxide-semiconductor transistor circuit defined in claim 1 wherein the first Schottky diode comprises an anode formed from the body of the first metal-oxide-semiconductor transistor and a cathode connected to the gate of the second metal-oxide-semiconductor transistor.

3. The gate-body cross-linked metal-oxide-semiconductor transistor circuit defined in claim 1 wherein:

the first Schottky diode comprises an anode formed from the body of the first metal-oxide-semiconductor transistor and a cathode connected to the gate of the second metal-oxide-semiconductor transistor; and the second Schottky diode comprises an anode formed from the body of the second metal-oxide-semiconductor transistor and a cathode connected to the gate of the first metal-oxide-semiconductor transistor.

4. The gate-body cross-linked metal-oxide-semiconductor transistor circuit defined in claim 1 further comprising an inverter that receives a control signal and provides a corresponding complement of the control signal, wherein the control signal is applied to the gate of the first metal-oxide-semiconductor transistor while the complement of the control signal is applied to the gate of the second metal-oxide-semiconductor transistor.

5. The gate-body cross-linked metal-oxide-semiconductor transistor circuit defined in claim 1 further comprising a silicon-on-insulator substrate having a silicon layer formed on a buried oxide layer, wherein the silicon layer is used to form the bodies of the first and second metal-oxide-semiconductor transistors.

6. The gate-body cross-linked metal-oxide-semiconductor transistor circuit defined in claim 1 wherein the drain of the first metal-oxide-semiconductor transistor and the drain of the second metal-oxide-semiconductor are connected to each other.

7. The gate-body cross-linked metal-oxide-semiconductor transistor circuit defined in claim 1 further comprising a pull-up circuit having an output terminal, wherein the drain of the first metal-oxide-semiconductor transistor and the drain of the second metal-oxide-semiconductor transistors are both connected to the pull-up circuit output terminal.

8. The gate-body cross-linked metal-oxide-semiconductor transistor circuit defined in claim 1 wherein:
   the Schottky diodes each have a cathode formed from a layer of metal; and
   the bodies of the first and second metal-oxide-semiconductor transistors comprise silicon that is directly connected the layers of metal in the cathodes of the Schottky diodes.

9. A gate-body cross-linked metal-oxide-semiconductor transistor circuit formed on a silicon-on-insulating substrate, comprising:
   a first metal-oxide-semiconductor transistor having a gate, a source, a drain, and a body;
   a second metal-oxide-semiconductor transistor have a gate, a source, a drain, and a body;
   a first Schottky diode having an anode formed from the body of the first metal-oxide-semiconductor transistor and a cathode connected to the gate of the second metal-oxide-semiconductor transistor;
   a second Schottky diode having an anode formed from the body of the second metal-oxide-semiconductor transistor and a cathode connected to the gate of the first metal-oxide-semiconductor transistor; and
   circuitry that applies a signal to the gate of the first metal-oxide-semiconductor transistor while applying the complement of that signal to the gate of the second metal-oxide-semiconductor transistor.

10. The gate-body cross-linked metal-oxide-semiconductor transistor circuit defined in claim 9 further comprising:
   a first input connected to the source of the first metal-oxide-semiconductor transistor;
   a second input connected to the source of the second metal-oxide-semiconductor transistor; and
   an output connected to both the drain of the first metal-oxide-semiconductor transistor and the drain of the second metal-oxide-semiconductor transistor.

11. The gate-body cross-linked metal-oxide-semiconductor transistor circuit defined in claim 9 further comprising:
   a first input connected to the source of the first metal-oxide-semiconductor transistor;
   a second input connected to the source of the second metal-oxide-semiconductor transistor;
   an output connected to both the drain of the first metal-oxide-semiconductor transistor and the drain of the second metal-oxide-semiconductor transistor; and
   a pull-up circuit connected to the output.

12. A gate-body cross-linked metal-oxide-semiconductor transistor circuit, comprising:
   a first and second inputs;
   an output;
   a first metal-oxide-semiconductor transistor having a gate, first and second source-drain terminals, and a body, wherein the first source-drain terminal of the first metal-oxide-semiconductor transistor is connected to the first input and wherein the second source-drain terminal of the first metal-oxide-semiconductor transistor is connected to the output;
   a second metal-oxide-semiconductor transistor having a gate, first and second source-drain terminals, and a body, wherein the first source-drain terminal of the second metal-oxide-semiconductor transistor is connected to the second input and wherein the second source-drain terminal of the second metal-oxide-semiconductor transistor is connected to the output;
   a first Schottky diode having an anode formed from the body of the first metal-oxide-semiconductor transistor and a cathode connected to the gate of the second metal-oxide-semiconductor transistor;
   a second Schottky diode having an anode formed from the body of the second metal-oxide-semiconductor transistor and a cathode connected to the gate of the first metal-oxide-semiconductor transistor; and
   circuitry that applies a signal to the gate of the first metal-oxide-semiconductor transistor while applying the complement of that signal to the gate of the second metal-oxide-semiconductor transistor.

13. The gate-body cross-linked metal-oxide-semiconductor transistor circuit defined in claim 12 wherein the circuitry that applies the signal comprises an inverter that receives a control signal and provides its complement to the gate of the second metal-oxide-semiconductor transistor.

14. The gate-body cross-linked metal-oxide-semiconductor transistor circuit defined in claim 13 further comprising a silicon-on-insulator substrate having a silicon layer formed on a buried oxide layer, wherein the silicon layer is used to form the bodies of the first and second metal-oxide-semiconductor transistors.

15. The gate-body cross-linked metal-oxide-semiconductor transistor circuit defined in claim 14 further comprising a pull-up circuit connected to the output terminal.

* * * * *